United States Patent [19]
Yeo

[11] Patent Number: 6,020,599
[45] Date of Patent: Feb. 1, 2000

[54] LIQUID CRYSTAL DISPLAY HAVING SEPARABLE GATE LINES AND GATE SHORTING BAR WHEN THE CONNECTION PORTION IS OXIDIZED

[75] Inventor: Ju-Cheon Yeo, Kyongki-do, Rep. of Korea

[73] Assignee: LG Electronics Inc, Seoul, Rep. of Korea

[21] Appl. No.: 08/982,294

[22] Filed: Dec. 2, 1997

[30] Foreign Application Priority Data

Dec. 4, 1996 [KR] Rep. of Korea ............... 96-61506

[51] Int. Cl.[7] .................................................. H01L 29/04
[52] U.S. Cl. ........................... 257/59; 257/72; 257/347; 257/349; 257/352; 349/41; 349/42; 349/43; 349/46; 349/47
[58] Field of Search .......................... 257/59, 72, 347, 257/349, 352; 349/41, 42, 43, 46, 47

[56] References Cited

U.S. PATENT DOCUMENTS

5,684,547  11/1997  Park et al. ........................ 349/42
5,767,530   6/1998  Ha ................................... 257/408

*Primary Examiner*—Fetsum Abraham
*Attorney, Agent, or Firm*—Morgan, Lewis & Bockius LLP

[57] ABSTRACT

A thin film transistor array substrate of a liquid crystal display is provided which includes a substrate, a shorting bar on the substrate, and a plurality of gate lines connected to the shorting bar, each gate line having an electrically non-connection region and a connection region connecting the non-connection region to the shorting bar, wherein said connection region has a thickness such that the gate lines and the shorting bar are electrically separated from each other when the connection regions are anodized.

26 Claims, 9 Drawing Sheets

LIQUID CRYSTAL DISPLAY HAVING SEPARABLE GATE LINES AND GATE SHORTING BAR WHEN THE CONNECTION PORTION IS OXIDIZED

This application claims the benefit of Korean Patent Application No. 96-61506, filed in Korea on Dec. 4, 1996, which is hereby incorporated by reference.

BACKGROUND OF THE INVENTION

1. Field of the Invention

The present invention relates to a liquid crystal display and, more particularly, to a thin film transistor array substrate of a liquid crystal display which is provided with a modified connection region to allow an automatic separation of gate lines from a shorting bar.

2. Discussion of Related Art

An anodizing process is a process for growing an oxide layer on the surface of a metal by submerging the metal in an electrolytic solution. A positive (+) power is then applied to the metal, while a negative (−) power is applied to another metal, e.g., platinum, or the like. This technique is carried out to form a gate insulating layer on gate electrodes and gate lines, which are patterned during the fabrication of a liquid crystal display.

A shorting bar is a metal pattern for connecting the gate lines to an external power source and applying electric power to them so as to cause an anodization of the gate lines and the gate electrodes connected to the gate lines. After the fabrication of the liquid crystal display is completed, the shorting bar must be separated from the gate line in order to examine and operate the finished liquid crystal display.

Figure 1A:
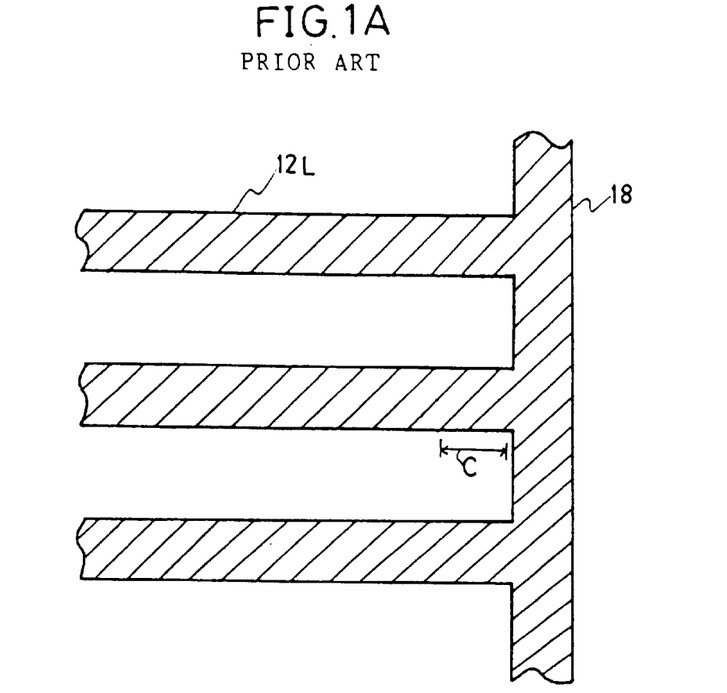
FIGS. 1A to 1C illustrate connection regions between gate lines and a shorting bar and a process of separating the gate lines from the shorting bar in a conventional liquid crystal display.
Figure 1B:
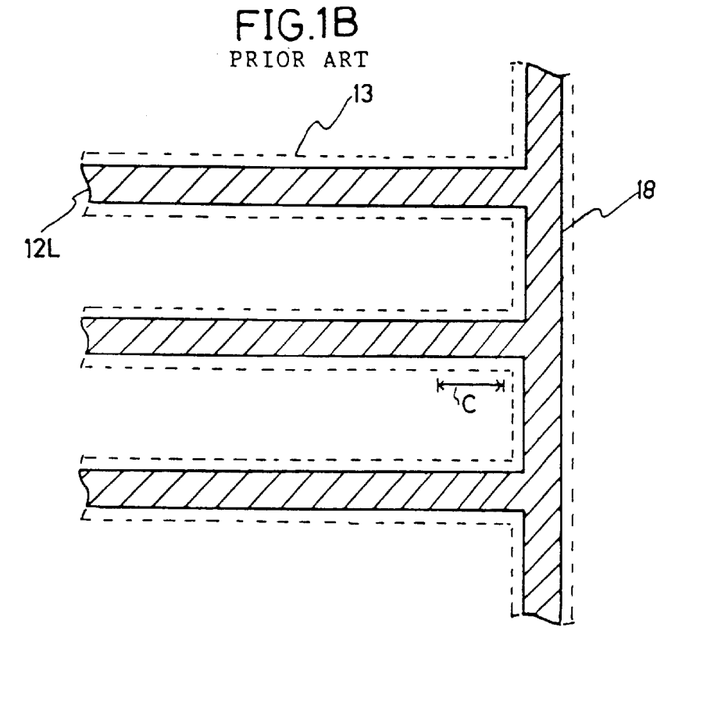
Figure 1C:
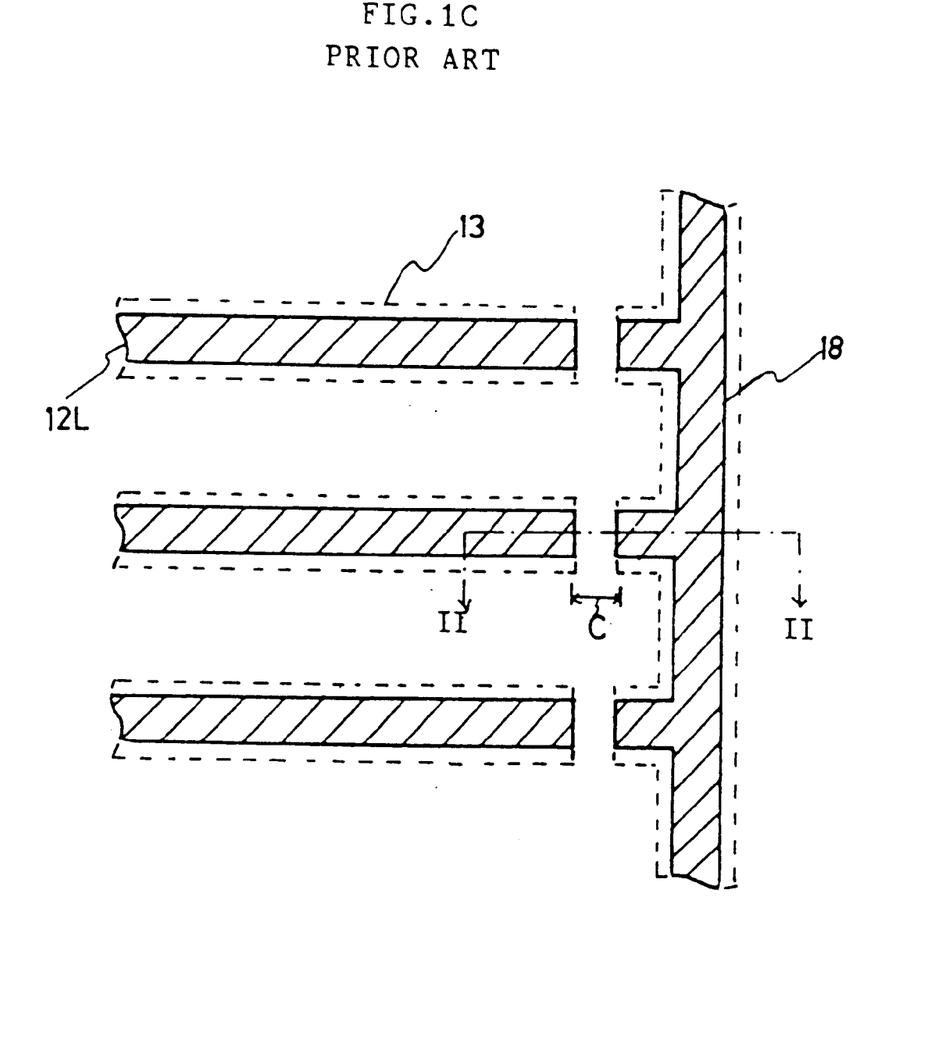

FIGS. 1A, 1B and 1C illustrate the configuration of a plurality of gate lines 12L and a shorting bar 18 in a conventional liquid crystal display. FIG. 1A shows the arrangement before an anodizing process, FIG. 1B shows the arrangement after the anodizing process, and FIG. 1C shows the arrangement after a cutting process using a laser.

As shown in FIG. 1A, a plurality of gate lines 12L are arranged on a substrate and each of the gate lines 12L is connected to a shorting bar 18. In an anodizing process, external power is applied to the respective gate lines 12L via the shorting bar 18.

Before the anodizing process, each gate line 12L is connected to the shorting bar 18 by a connection region C. Hereinafter, the portion of the gate line connected to the shorting bar is referred to as "connection region". This connection region has the same width as the rest of the gate line 12L in the conventional liquid crystal display.

When the substrate having the above connections is submerged in an electrolytic solution to carry out an anodizing process, an anodic oxide layer 13 is formed to have a predetermined width on the lateral sides of the gate lines 12L and the shorting bar 18, as shown in FIG. 1B. The gate lines 12L remain in connection with the shorting bar 18 after the anodizing process.

When the substrate is finished, it is necessary to cut the connection regions C between the gate lines 12L and the shorting bar 18, as shown in FIG. 1C.

FIGS. 2A to 2F illustrate a process for fabricating the conventional liquid crystal display which includes an anodizing step. Each figure shows two portions of the thin film transistor array substrate of the liquid crystal display device. The left side shows a thin film transistor, and the right side shows a connection region between a gate line and a shorting bar. The connection region is shown in a cross-sectional view taken along the line II—II in FIG. 1C.

Figure 2A:
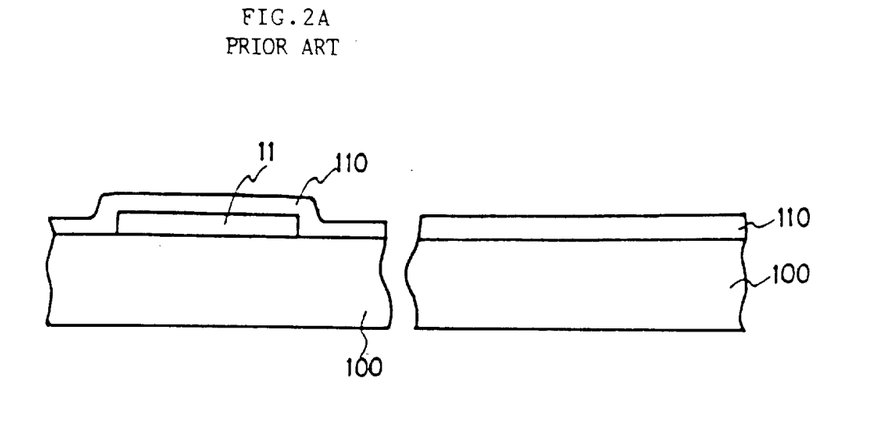
FIGS. 2A to 2F are cross-sectional views taken along the line II—II in FIG. 1C to illustrate a process for fabricating the conventional liquid crystal display.

Referring to FIG. 2A, a polysilicon layer is formed on an insulating substrate 100 and is patterned by photolithography to form an active layer 11. The polysilicon layer is formed by depositing an amorphous silicon layer and applying a laser beam to crystallize the amorphous silicon layer. An alternative method is to deposit polysilicon at a low temperature. To prevent any impurities contained in the substrate from penetrating into the active layer made of polysilicon, it is desirable to form a buffer layer by depositing an insulating material, such as silicon oxide or silicon nitride, before the polysilicon layer is formed. A gate insulating layer 110 is then formed on the whole surface by depositing an insulating material such as silicon oxide or the like.

Figure 2B:
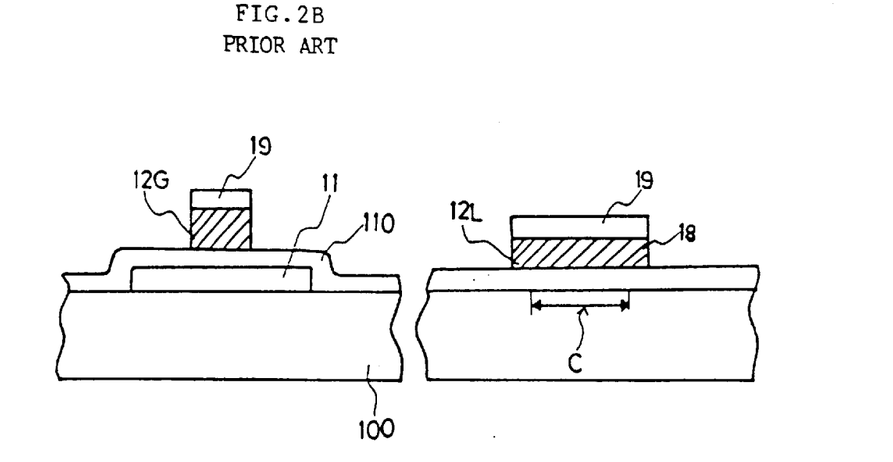

As shown in FIG. 2B, a metal layer, such as Al or the like, which can be anodized, and a photoresist layer are sequentially formed on the gate insulating layer 110. The photoresist layer is patterned by lithography to form a photoresist pattern 19, the metal layer is etched using the photoresist pattern 19 as a mask to form a gate electrode 12G, a gate line 12L extending from the gate electrode 12G, and a shorting bar 18. Accordingly, the gate electrode 12G, the gate line 12L, and the shorting bar 18 are made of the same metal material. The gate line 12L is connected with the shorting bar 18. The photoresist pattern 19 remains on the metal pattern of the gate electrode 12G, the gate line 12L extending from the gate electrode 12G, and the shorting bar 18.

Figure 2C:
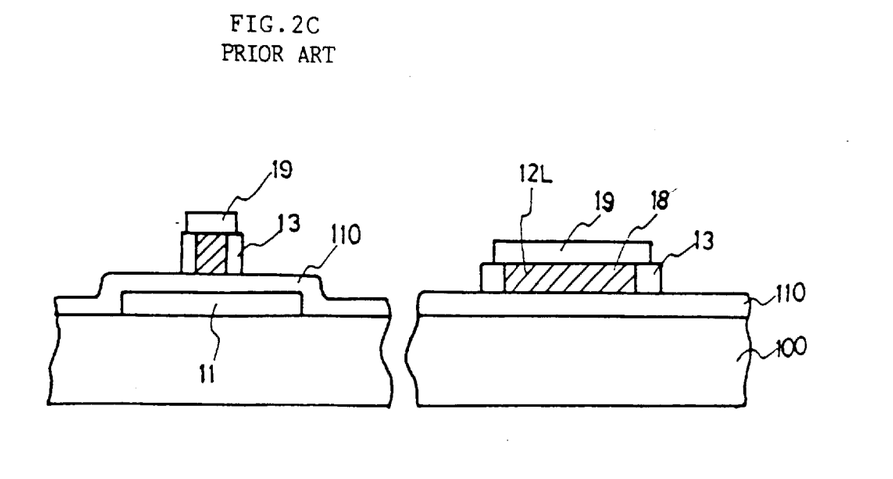

As shown in FIG. 2C, the substrate is immersed into an electrolytic solution to carry out an anodizing process. As a result, an anodic oxide layer 13, having a predetermined thickness, is formed on the lateral sides of the metal pattern.

Figure 2D:
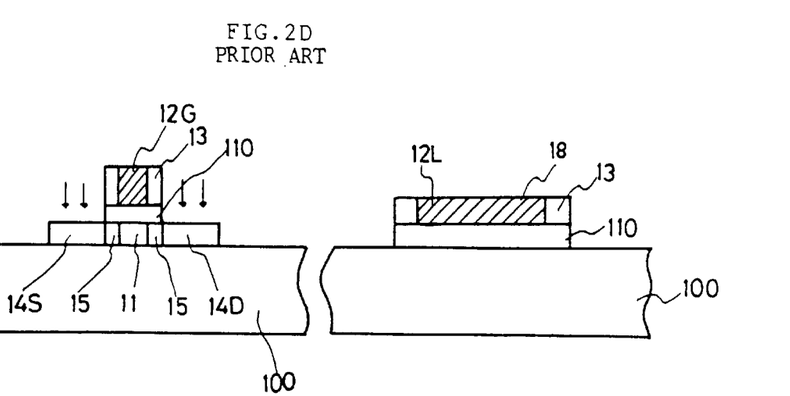

As shown in FIG. 2D, after the photoresist pattern 19 is removed, the gate insulating layer 110 is patterned by photolithography using the gate electrode 12G and the anodic oxide layer 13 formed on the lateral sides of the gate electrode 12G as a mask to expose a part of the active layer 11.

An $n^+$-type layer is formed in the exposed portion of the active layer 11 by heavily doping the entire surface with impurities of $n^+$ conductivity type. The $n^+$-type layer becomes a source region 14S and a drain region 14D. The active layer under the gate electrode 12G becomes a channel region 11C. The portions between the source region 14S and the channel region 11C and between the drain region 14D and the channel region 11C become offset regions 15.

Figure 2E:
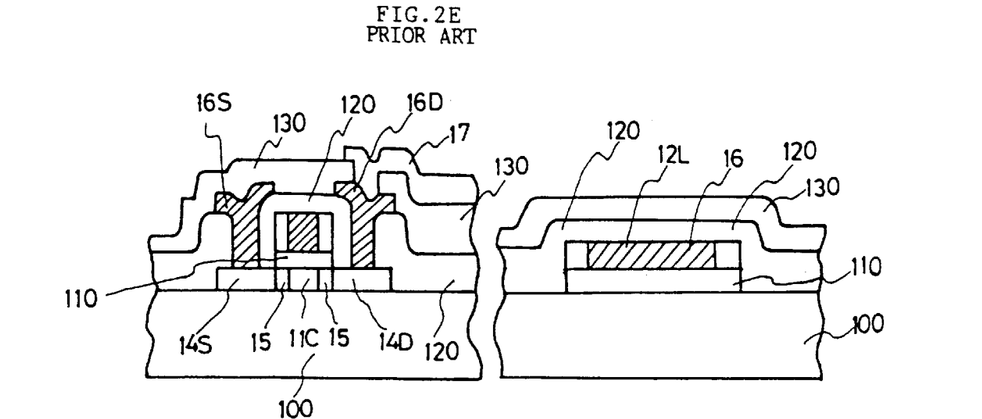

As shown in FIG. 2E, an insulating interlayer 120 is formed by depositing an insulating material, such as silicon oxide or the like, on the entire surface. Portions of the insulating interlayer 120 are removed by photolithography to form contact holes exposing the source and drain regions 14S and 14D.

Subsequently, a conductive material, such as Cr or the like, is deposited on the entire surface and is patterned by photolithography to form a source electrode 16S connected to the source region 14S and a drain electrode 16D connected to the drain region 14D.

Then, a protective layer 130 is formed by depositing an insulating material on the entire surface. A portion of the protective layer 130 is removed by photolithography to form a contact hole exposing a part of the drain electrode 16D.

Then, a transparent conductive layer is formed by sputtering on the entire surface and is patterned by photolithography to form a pixel electrode 17 connected to the drain electrode 16D.

Figure 2F:
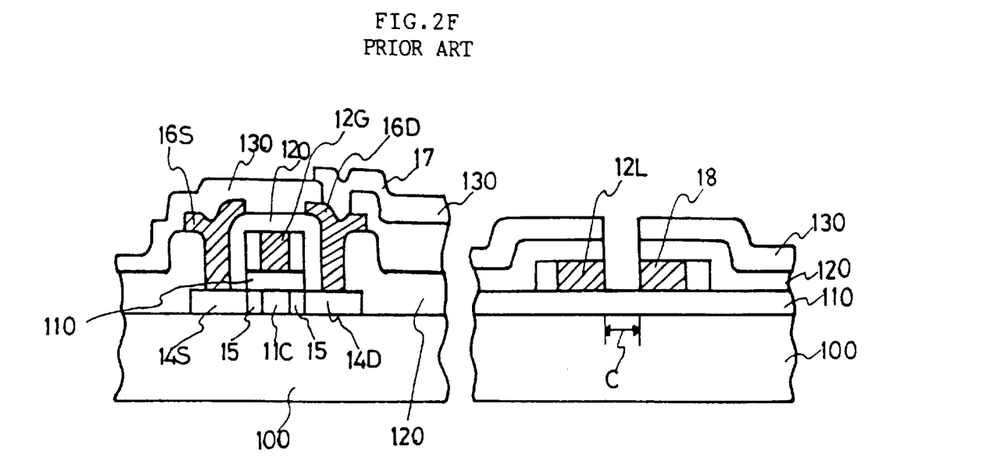

As shown in FIG. 2F, the connection region C, located between the shorting bar 18 and the gate line 12L, is cut by photo-etching or by a laser beam so as to allow for testing of the finished substrate.

The process of cutting the connection region C between the shorting bar 18 and the gate line 12L is carried out in the final stage of fabrication, but it can be better accomplished after the anodizing process as a matter of convenience.

As described above, an additional process is required for severing the connections between the gate lines and the shorting bar for the purpose of testing the device. This additional step is necessary because the gate line is typically around 10 $\mu$m in width while the anode oxide layer is grown up to a width of 1~1.5 $\mu$m at most. Elimination of this step would simplify the manufacturing process.

SUMMARY OF THE INVENTION

Accordingly, the present invention is directed to a thin film transistor array substrate of a liquid crystal display device that substantially obviates the problems due to limitations and disadvantages of the related art.

An object of the present invention is to provide an improved thin film transistor array substrate of a liquid crystal display device which is designed to automatically separate gate lines from a shorting bar.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the thin film transistor array substrate according to the present invention includes a substrate, a shorting bar on the substrate, and a plurality of gate lines connected to the shorting bar, each gate line having a connection region for connecting the gate line to the shorting bar. The connection regions each have a thickness such that the gate lines and the shorting bar are electrically separated from each other when the connection regions are anodized.

In another aspect of the present invention, an intermediate substrate for use in the manufacture of a liquid crystal display is provided having a step of anodizing an anodizable metal to form an anodic oxidization layer penetrating into the anodizable metal with a predetermined penetration depth on each side of the anodizable metal, the intermediate substrate including a substrate, a plurality of gate lines over the substrate, a shorting bar over the substrate, a plurality of connection leads each made of the anodizable metal over the substrate, each of the connection leads connecting each of the gate lines to the shorting bar, the narrowest part of each connection lead being smaller than two times the predetermined penetration depth of the anodic oxidization layer so that each of the gate lines is electrically disconnected from the shorting bar during the step of anodizing the anodizable metal.

In another aspect of the present invention, a method for manufacturing a liquid crystal display on a substrate, includes the steps of forming an anodizable metal layer over the substrate, patterning the anodizable metal layer to form a plurality of electrodes, a shorting bar, and a plurality of connection leads, the plurality of connection leads each connecting each of the plurality of electrodes to the shorting bar; and anodizing the pattern of the anodizable metal layer to form an anodic oxidization layer penetrating into the anodizable metal with a predetermined penetration depth on each side of the pattern of the anodizable metal layer, the predetermined penetration depth being larger than the minimum pattern width of each connection lead to electrically disconnect the corresponding electrode from the shorting bar.

In a further aspect of the present invention, the thin film transistor array substrate of a liquid crystal display is made by the process of forming a shorting bar on a substrate, forming a plurality of gate lines on the substrate, each gate line having a connection region of a reduced thickness from the remaining part of the gate line, connecting that gate line to the shorting bar, and anodizing the connection regions to electrically separate each of the gate lines from the shorting bar, leaving a remnant portion of each gate line connected to the shorting bar. The thin film transistor array substrate of the liquid crystal display includes a substrate, a shorting bar on the substrate, and a plurality of gate lines having been electrically separated from the shorting bar and each of the plurality of gate lines leaving a remnant portion of itself connected to the shorting bar upon separation.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3A:
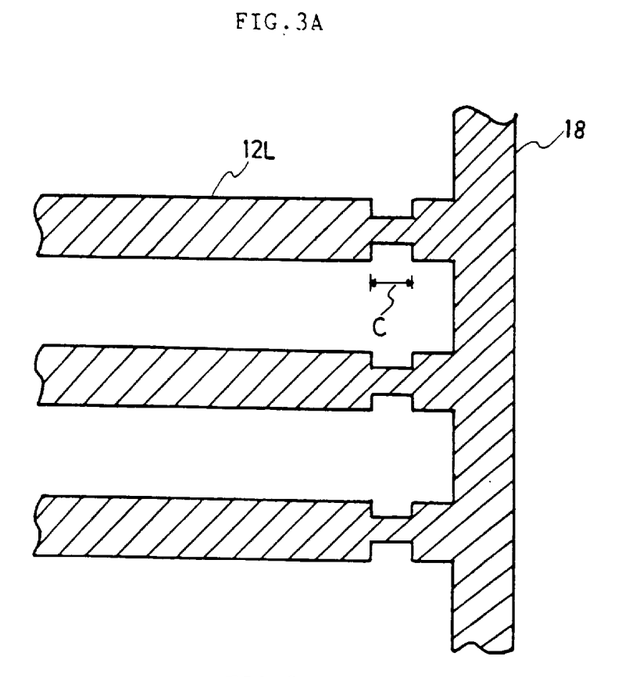
FIGS. 3A and 3B illustrate connection regions between gate lines and a shorting bar and a process of separating the gate lines from the shorting bar in a liquid crystal display according to a first preferred embodiment of the present invention.
Figure 3B:
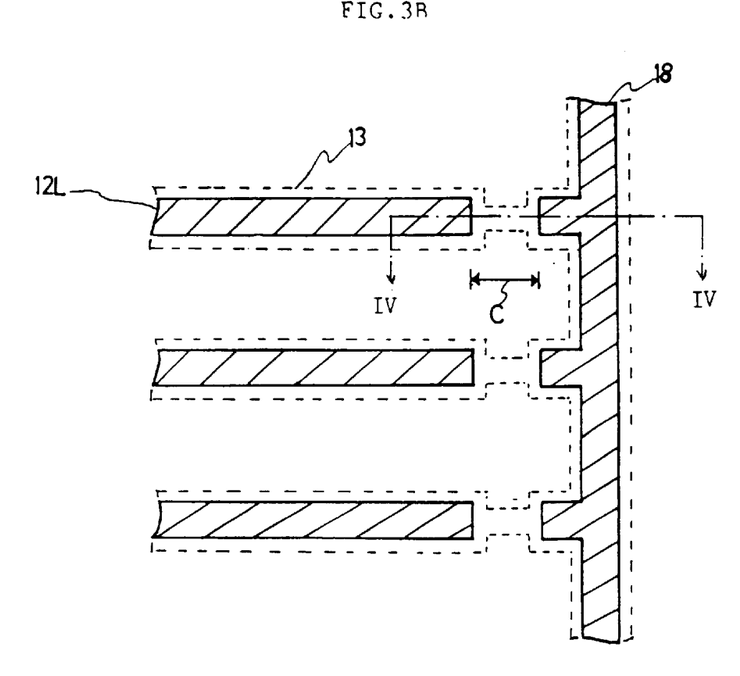

FIGS. 3A and 3B illustrate connection regions between gate lines and a shorting bar in a thin film transistor array substrate of a liquid crystal display according to a first preferred embodiment of the present invention. FIG. 3A shows the liquid crystal display arrangement before an anodizing process, while FIG. 3B shows the arrangement after the anodizing process.

Referring to FIG. 3A, a plurality of gate lines 12L are arranged on a substrate and each of the gate lines 12L has a connection region C for connecting that gate line to a shorting bar 18. Each connection region C between-the non-connection region of the gate lines 12L and the shorting bar 18 is narrower than the gate lines 12L in width. The connection region C is preferably two times or less as wide as an anodic oxide layer 13 that will be formed later.

After the anodizing process, as shown in FIG. 3B, an anodic oxide layer 13 is formed on the entire sides of the gate line 12L and the shorting bar 18. Accordingly, the gate line and the shorting bar are automatically separated from each other by the anodization of the whole connection region C.

The width of the anodic oxide layer formed during the fabrication of a liquid crystal display, is typically within the range of 1 µm to 1.5 µm. Accordingly, if the connection regions C have a width of around 2 µm to 3 µm, the anodic oxide layer is formed on the whole part of the connection regions, thereby isolating the gate lines from the shorting bar.

FIGS. 4A to 4E illustrate a process for fabricating the liquid crystal display of FIGS. 3A and 3B. FIGS. 4A to 4E show two portions of the thin film transistor array substrate of the liquid crystal display device. The left side shows a thin film transistor, and the right side shows a connection region between the gate line and the shorting bar. The connection region is shown in a cross-sectional view taken along the line IV—IV in FIG. 3B. The process is performed in a similar manner to the process described with reference to FIGS. 1A to 2F above. In the present invention, the connection region C is designed such that the gate lines 12L are automatically separated from the shorting bar 18 upon formation of the anodic oxide layer 13.

Figure 4A:
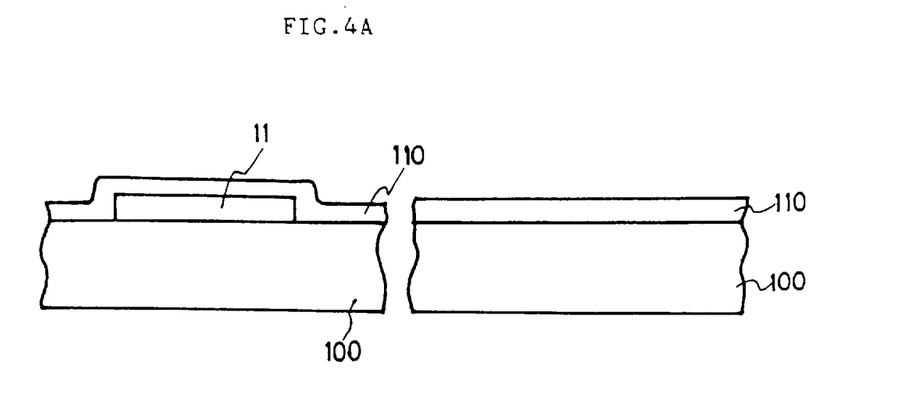
FIGS. 4A to 4E are cross-sectional views taken along the line IV—IV in FIG. 3B to illustrate a process for fabricating the liquid crystal display according to the first preferred embodiment of the present invention.

Referring to FIG. 4A, a semiconductor layer such as a polysilicon layer is formed on a substrate 100 and is patterned by photolithography to form an active layer 11. The polysilicon layer may be formed by forming an amorphous silicon layer by a known method and applying a laser to crystallize the amorphous silicon layer, or by depositing polysilicon at a low temperature, for example. To prevent impurities that may be contained in the substrate 100 from penetrating into the active layer (the polysilicon layer, for example), it is desirable to form a buffer layer by depositing an insulating material, such as silicon oxide or silicon nitride, on the substrate 100 before forming the polysilicon layer.

Then, a gate insulating layer 110 is formed on the entire surface by depositing an insulating material, such as silicon oxide or the like.

Figure 4B:
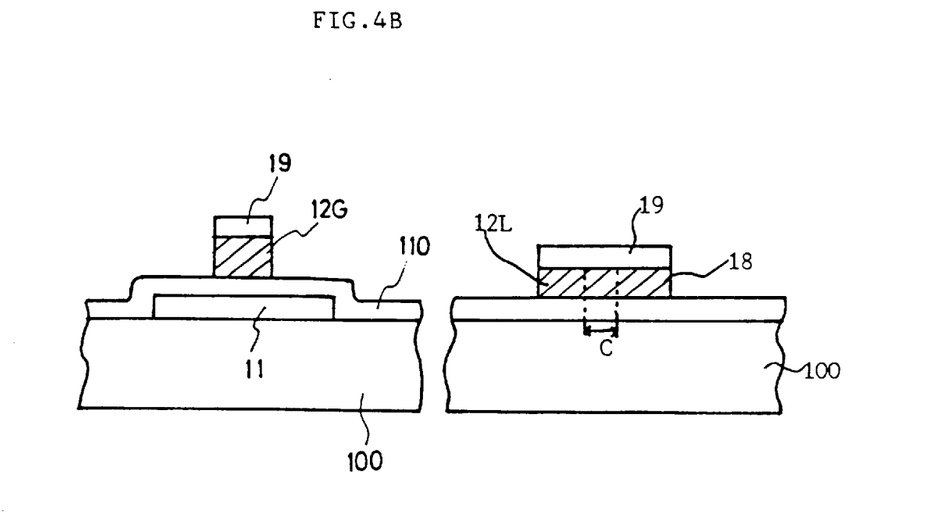

As shown in FIG. 4B, a metal layer, such as Al, an Al alloy, Ta, Ti, or the like, which can be anodized, and a photoresist layer are sequentially formed on the gate insulating layer 110. The photoresist layer is patterned by lithography to form a photoresist pattern 19. The metal layer is patterned using the photoresist pattern 19 as a mask to form at least one gate electrode 12G, at least one gate line 12L extending from a corresponding gate electrode, and a shorting bar 18. Accordingly, the gate electrode 12G, the gate line 12L, and the shorting bar 18 are made of the same metal material. The gate line 12L is patterned to be connected with the shorting bar 18 for the purpose of applying an anodizing process to the gate line-shorting bar combination. The photoresist pattern 19 remains on the metal pattern until after the anodizing process.

Figure 4C:
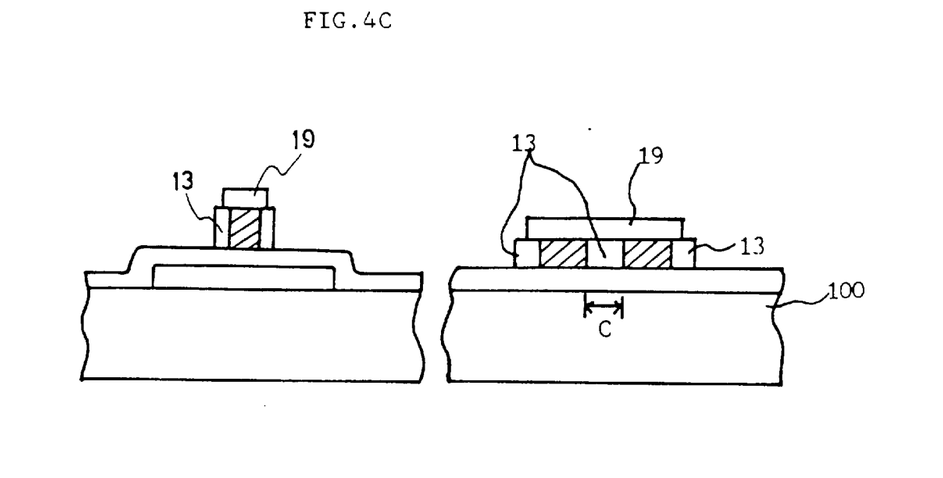

As shown in FIG. 4C, the substrate is immersed into an electrolytic solution to carry out an anodizing process. As a result, an anodic oxide layer 13 is formed at a predetermined thickness on the lateral sides of the gate line 12L and the shorting bar 18. The gate line 12L is automatically separated from the shorting bar 18 because the connection region has such a width to allow the anodic oxide layer 13 to be formed on the whole part thereof.

Figure 4D:
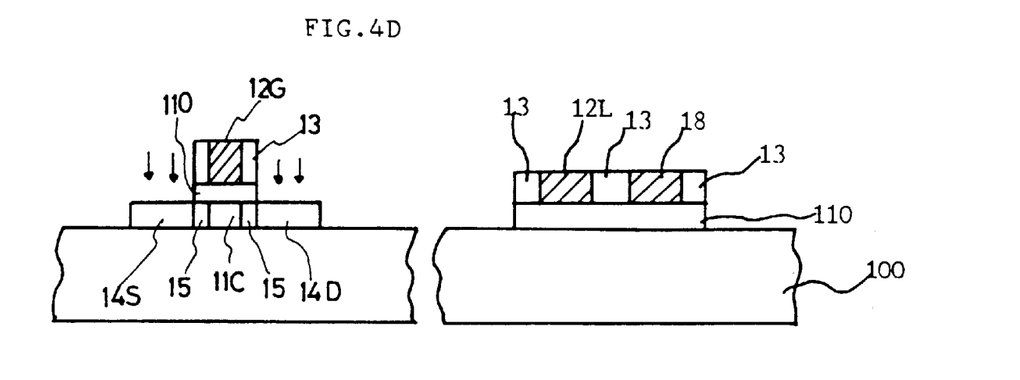

As shown in FIG. 4D, the photoresist pattern 19 is removed, and the gate insulating layer 110 is patterned by photolithography using the gate electrode 12G and the anode oxide layer 13 on the lateral sides of the gate electrode 12G as a mask to expose portions of the active layer 11 under the gate insulating layer 110. Then, source and drain regions 14S and 14D are formed by doping the exposed portions of the active layer 11 with impurities at a high dosage. The active layer under the gate electrode 12G becomes a channel region 11C. The portions between the source region 14S and the channel region 11C and between the drain region 14D and the channel region 11C become offset regions 15.

Figure 4E:
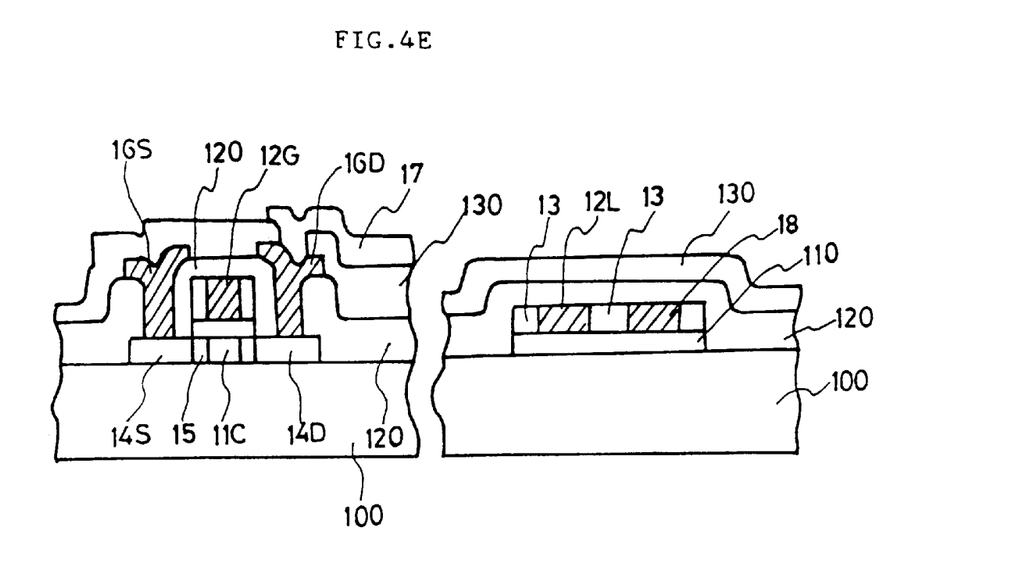

As shown in FIG. 4E, an insulating interlayer 120 is formed by depositing an insulating material, such as silicon oxide or the like, on the entire surface. Portions of the insulating interlayer 120 are removed by photolithography to form contact holes exposing parts of the source and drain regions 14S and 14D.

A metal layer, made of Cr or the like, is formed on the entire surface and patterned by photolithography to form a source electrode 16S connected to the source region 14S, a signal line (not illustrated in the figure), and a drain electrode 16D connected to the drain region 14D.

Then, a protective layer 130 is formed by depositing an insulating material on the entire surface. A portion of the protective layer 130 is removed by photolithography to form a contact hole exposing a part of the drain electrode 16D.

A transparent conductive layer is formed on the entire surface and patterned by photolithography to form a pixel electrode 17 connected to the drain electrode 16D. This completes the liquid crystal display device.

Figure 5A:
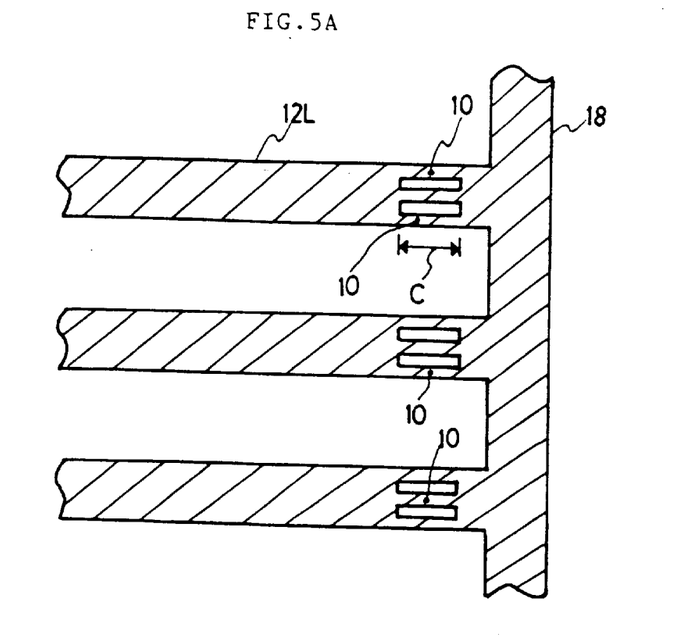
FIGS. 5A and 5B illustrate connection regions between gate lines and a shorting bar and a process of separating the gate lines from the shorting bar in a liquid crystal display according to a second preferred embodiment of the present invention.
Figure 5B:
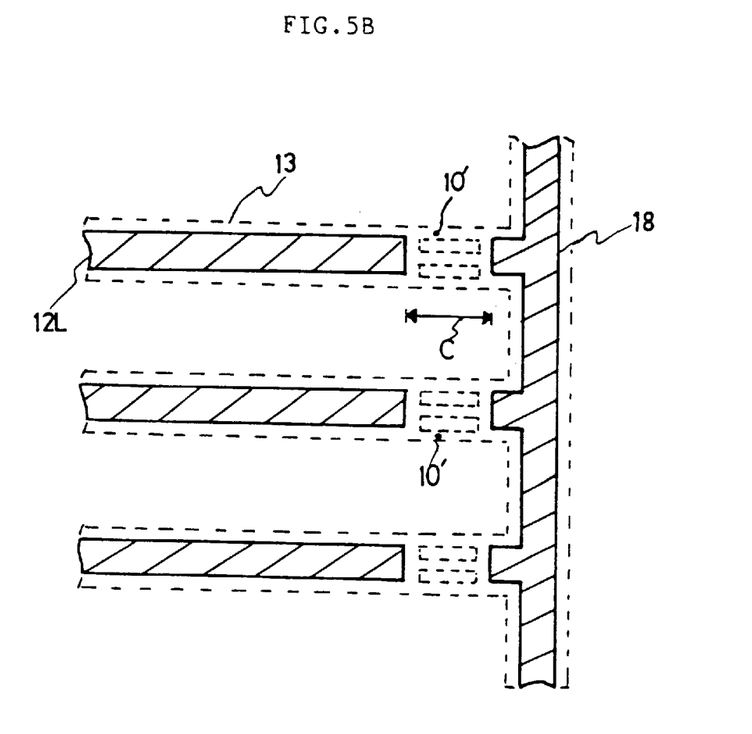

FIGS. 5A and 5B illustrate the connection of each gate line with the shorting bar at the connection region C of each gate line in a liquid crystal display according to a second preferred embodiment of the present invention. FIG. 5A shows the liquid crystal display before the anodizing process, and FIG. 5B shows the liquid crystal display after the anodizing process.

As shown in FIG. 5A, a plurality of gate lines 12L are connected to a shorting bar 18. Each connection region C for the gate lines 12L includes two or more connection bars 10, each having a predetermined width and connecting the gate lines 12L to the shorting bar 18. A redundancy effect can be obtained due to the two or more connection bars 10 in connection region C, as follows. Even if one of the connection bars 10 is disconnected due to defects or the like prior to the anodizing process, the remaining connection bar(s) secures the connection of the gate lines 12L to the shorting bar 18. Each connection bar 10 is preferably two times or less as wide as each anodic oxide layer 13 that will be formed later.

When an anodizing process is performed on the substrate having the above-described connections, as shown in FIG.

5B, an anodic oxide layer 13 is formed on the lateral sides of the gate lines 12L and the shorting bar 18. The entire surface of the connection bars 10 for connecting the gate lines 12L to the shorting bar 18 becomes anodized to separate the gate line 12L from the shorting bar 18. The reference numeral 10' in FIG. 5B indicates the anodized connection bars.

Figure 6A:
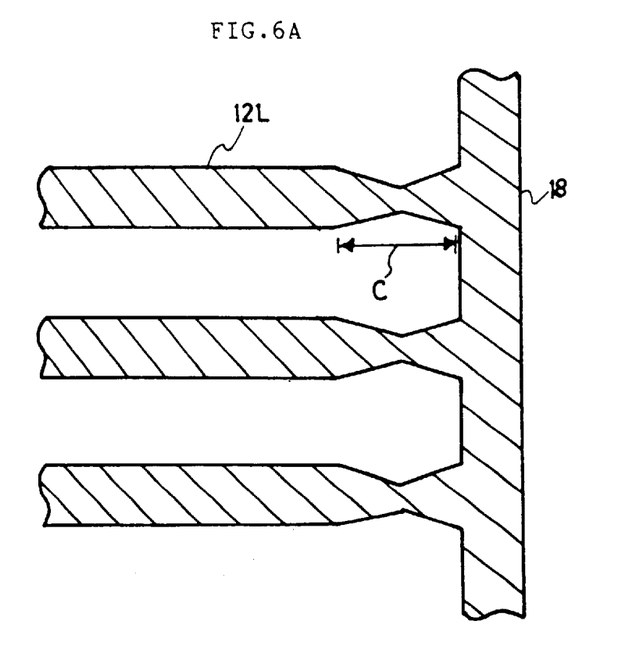
FIGS. 6A and 6B illustrate connection regions between gate lines and a shorting bar and a process of separating the gate lines from the shorting bar in a liquid crystal display according to a third preferred embodiment of the present invention.
Figure 6B:
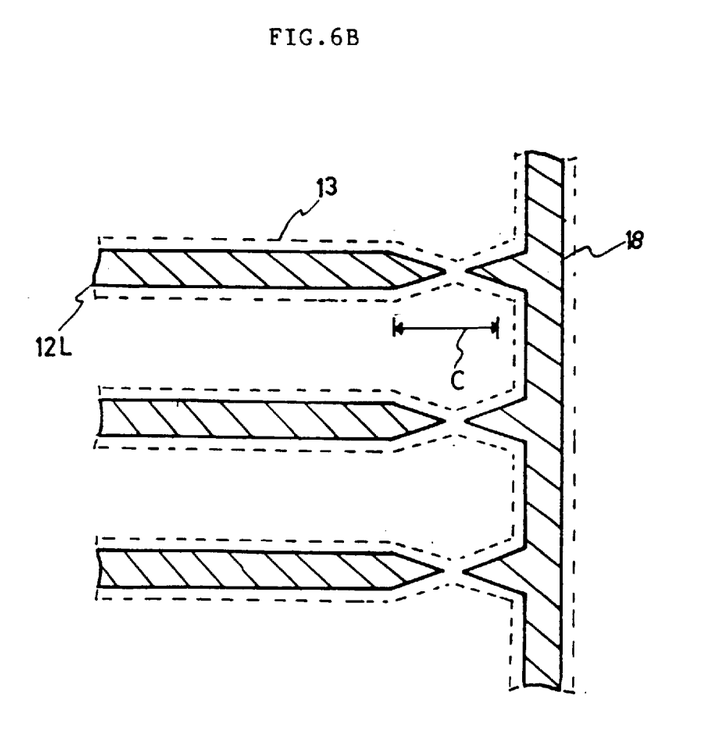

FIGS. 6A and 6B illustrate the connection region between gate lines and a shorting bar in a liquid crystal display according to a third preferred embodiment of the present invention. FIG. 6A shows the connection region before an anodizing process, and FIG. 6B is after the anodizing process.

As shown in FIG. 6A, a plurality of gate lines 12L are arranged on a substrate and each of the gate lines 12L is connected to a shorting bar 18. Each connection region C gets narrower from the side of the gate lines 12L and from the side of the shorting bar 18 to have a minimum width in a predetermined position adjacent the middle of the connection region C between the gate line side and the shorting bar side.

According to the third embodiment of the present invention, since an electric field is concentrated on the narrowest, minimum width portion of the connection region during an anodizing process, the anodization of this portion quickly occurs, forming the anodic oxide layer with a greater thickness than at other portions of the lines under the same anodizing conditions as the preceding embodiments. When the substrate having the above-described connections is anodized under the conditions to form the anodic oxide layer about 2~3 μm, the anodic oxide layer can be formed up to about 4~5 μm in the narrowest portion of the connection region C shown in FIGS. 6A and 6B. As a result, the connection region of this embodiment can be wider than that of the preceding embodiments.

After the anodizing process, as shown in FIG. 6B, the anodic oxide layer 13 is rapidly formed on the narrowest portion of the connection region C, thereby automatically separating the gate line 12L from the shorting bar 18.

As described above, according to the present invention, the connection region between each gate line and the shorting bar are formed at a decreased width from the rest of the gate line in consideration of the width of the anodic oxide layer to be formed thereon. Since the entire connection region is anodic oxidized, the gate lines and the shorting bar are automatically separated from each other upon the anodizing process. Thus, an additional process for severing the connections between the gate lines and the shorting bar, which is normally performed by laser beam application or photo-etching, can be omitted. This simplifies the manufacturing process.

It will be apparent to those skilled in the art that various modifications and variations can be made in the liquid crystal display of the present invention without departing from the spirit or scope of the invention. Thus, it is intended that the present invention cover the modifications and variations of this invention provided they come within the scope of the appended claims and their equivalents.

What is claimed is:

1. A thin film transistor array substrate comprising:
   a substrate;
   a shorting bar on the substrate; and
   a plurality of gate lines connected to the shorting bar, each gate line having a connection region connecting the gate line to the shorting bar, wherein each of the connection regions has a thickness such that the gate lines and the shorting bar are electrically and physically separated from each other when the connection regions are anodized.

2. The thin film transistor array substrate as claimed in claim 1, wherein the gate lines and the shorting bar are made of the same metal material.

3. The thin film transistor array substrate as claimed in claim 1, wherein the gate lines and the shorting bar are patterned by using one mask.

4. The thin film transistor array substrate as claimed in claim 1, wherein the gate lines and the shorting bar are made of an anodizable metal material.

5. The thin film transistor array substrate as claimed in claim 4, wherein the connection region of each gate line has a width of about 2 μm to 3 μm.

6. The thin film transistor array substrate as claimed in claim 4, wherein the connection region of each gate line is narrower than other portions of the gate line.

7. The thin film transistor array substrate as claimed in claim 4, wherein the connection region of each gate line includes two or more connection bars.

8. The thin film transistor array substrate as claimed in claim 4, wherein the anodizable metal material includes at least one of Al, an Al alloy, Ta, and Ti.

9. The thin film transistor array substrate as claimed in claim 1, wherein the connection region of each gate line has a width of about 2 μm to 3 μm.

10. The thin film transistor array substrate as claimed in claim 1, wherein the connection region of each gate line is narrower than other regions of the gate line.

11. The thin film transistor array substrate as claimed in claim 1, wherein the connection region of each gate line includes two or more connection bars.

12. An intermediate substrate for use in the manufacture of a liquid crystal display having a step of anodizing an anodizable metal to form an anodic oxidization layer penetrating into the anodizable metal with a predetermined penetration depth on each side of the anodizable metal, the intermediate substrate comprising:
   a substrate;
   a plurality of gate lines over the substrate;
   a shorting bar over the substrate; and
   a plurality of connection leads each made of the anodizable metal over the substrate, each of the connection leads connecting each of the gate lines to the shorting bar, the narrowest part of each connection lead being smaller than two times the predetermined penetration depth of the anodic oxidization layer so that each of the gate lines is electrically and physically disconnected from the shorting bar as result of the step of anodizing the anodizable metal.

13. The intermediate substrate according to claim 12, wherein the plurality of gate lines, the shorting bar, and the plurality of connection leads are integrally formed of the anodizable metal, the plurality of gate lines and the shorting bar all being substantially wider than two times the predetermined penetration depth of the anodic oxidization layer.

14. The intermediate substrate according to claim 12, wherein each of the plurality of connection leads includes a plurality of connection bars each having a width smaller than two times the predetermined penetration depth of the anodic oxidization layer.

15. A thin film transistor array substrate of a liquid crystal display comprising a substrate, a shorting bar on the substrate, and a plurality of gate lines having been electrically separated from the shorting bar, each of the respective gate lines leaving a remnant portion of itself connected to the shorting bar after the respective gate lines have been electrically and physically separated from the shorting bar, the thin film transistor array substrate being made by the process of:

forming the shorting bar on the substrate;

forming the plurality of gate lines on the substrate, each gate line having a connection region, of a reduced thickness from the remaining part of the gate line, connecting that gate line to the shorting bar; and     anodizing the connection regions to electrically and physically separate each of the respective gate lines from the shorting bar, leaving a remnant portion of each respective gate line connected to the shorting bar after the respective gate lines have been electrically and physically separated from the shorting bar.

16. The thin film transistor array substrate as claimed in claim 15, wherein the gate lines and the shorting bar are made of the same metal material.

17. The thin film transistor array substrate as claimed in claim 15 wherein the gate lines and the shorting bar are patterned by using one mask.

18. The thin film transistor array substrate as claimed in claim 15, wherein the gate lines and the shorting bar are made of an anodizable metal material.

19. The thin film transistor array substrate as claimed in claim 15, wherein the connection region of each gate line is formed with a width of about 2 $\mu$m to 3 $\mu$m.

20. The thin film transistor array substrate as claimed in claim 18, wherein the connection region of each gate line gets narrower from the side of said remaining part of the gate line and from the side of the shorting bar to have a minimum width in a predetermined position in the connection region.

21. The thin film transistor array substrate as claimed in claim 18, wherein the connection region of each gate line has two or more connection bars.

22. The thin film transistor array substrate as claimed in claim 18, wherein the anodizable metal material includes at least one of Al, an Al alloy, Ta, and Ti.

23. The thin film transistor array substrate as claimed in claim 15, wherein the connection region of each gate line has a width of about 2 $\mu$m to 3 $\mu$m.

24. The thin film transistor array substrate as claimed in claim 15, wherein the connection region of each gate line becomes narrower from the side of the remaining part of the gate line and from the side of the shorting bar to have a minimum width in a predetermined position in the connection region.

25. The thin film transistor array substrate as claimed in claim 15, wherein the connection region of each gate line includes multiple connection bars.

26. The thin film transistor array substrate as claimed in claim 15, wherein the anodizable metal material includes at least one of Al, Al alloy, Ta and Ti.

\* \* \* \* \*